United States Patent
Hsu

(10) Patent No.: US 8,461,879 B1
(45) Date of Patent: Jun. 11, 2013

(54) LOW LATENCY INTER-DIE TRIGGER SERIAL INTERFACE FOR ADC

(75) Inventor: Tsing Hsu, Allen, TX (US)

(73) Assignee: Active-Semi, Inc. (VG)

( * ) Notice: Subject to any disclaimer, the term of this patent is extended or adjusted under 35 U.S.C. 154(b) by 0 days.

(21) Appl. No.: 13/481,921

(22) Filed: May 28, 2012

(51) Int. Cl.
*G11C 27/02* (2006.01)
*H03K 5/00* (2006.01)
*H03K 17/00* (2006.01)

(52) U.S. Cl.
USPC ............. 327/94; 327/91; 327/92; 327/93

(58) Field of Classification Search
USPC ................................. 327/91, 92, 94
See application file for complete search history.

(56) References Cited

U.S. PATENT DOCUMENTS 7,031,863 B2 * 4/2006 Maher et al. ............ 702/104

* cited by examiner

*Primary Examiner* — John Poos
(74) *Attorney, Agent, or Firm* — Imperium Patent Works; T. Lester Wallace

(57) ABSTRACT

A packaged controller for closed-loop control applications includes two dice packaged together in a semiconductor package. The first die is optimized for digital circuitry and includes a processor, an ADC, a serial bus interface, and a sequencer. The second die is optimized for analog circuitry and includes a serial bus interface, a plurality of sample/hold circuits, and an analog multiplexer. The sequencer on the first die causes a series of multi-bit values to be communicated serially across a low latency serial bus to the second die, and thereby controls the analog multiplexer and the asserting of a sample/hold signal on the second die. Under control of the sequencer, multiple voltages are captured simultaneously on the second die, and then are multiplexed one by one to the ADC on the first die for conversion into digital values. The architecture reduces complexity and cost of the overall packaged controller.

20 Claims, 12 Drawing Sheets

TX BUS I/F AND RX BUS I/F IN MORE DETAIL

PACKAGED CONTROLLER

MEASURE THREE VOLTAGES AND THREE CURRENTS

MEASURE THREE VOLTAGES AND THREE CURRENTS

TX BUS I/F AND RX BUS I/F IN
MORE DETAIL

| SIGNALS INTO COMBINATORIAL LOGIC OF RX BUS I/F | | | | | | | | SIGNALS OUTPUT BY COMBINATORIAL LOGIC OF RX BUS I/F | |
|---|---|---|---|---|---|---|---|---|---|
| D1 | D2 | D3 | D4 | D5 | D6 | D7 | D8 | S/H | AMUXSEL[1:4] |
| 0 | 0 | D3 | D4 | D5 | D6 | D7 | D8 | 0 | 0,0,0,0 |
| 0 | 1 | D3 | D4 | D5 | D6 | D7 | D8 | D3 | D5,D6,D7,D8 |
| 1 | 0 | D3 | D4 | D5 | D6 | D7 | D8 | 0 | 0,0,0,0 |
| 1 | 1 | D3 | D4 | D5 | D6 | D7 | D8 | 0 | 0,0,0,0 |

← UNUSED IN THIS EXAMPLE

LOGIC TABLE OF COMBINATORIAL
LOGIC BLOCK 107

SEQUENCER CONTROL REGISTERS

SEQUENCER MODE CONTROL REGISTER

OPTION: SEND DATAIN AFTER ADC START

OPTION: DO NOT SEND DATAIN

LOW LATENCY INTER-DIE TRIGGER SERIAL INTERFACE FOR ADC

TECHNICAL FIELD

The present disclosure relates generally to controllers for closed-loop control applications, and more particularly relates to controllers for low-cost closed-loop control applications.

BACKGROUND INFORMATION

In microcontroller-based closed-loop control applications such as cost sensitive motor control and multi-channel power conversion applications, the microcontroller typically includes an Analog-to-Digital Converter (ADC) and a processor. The ADC is used to sample voltages and/or currents existing in the system being controlled. In some applications, these samples need to be taken at the same time or nearly at the same time because relationships between the quantities being measured are important. Accordingly, a set of related samples is taken, processing is then performed on the samples to calculate a control output, and then the control output is provided back to the system in order to control the system. This entire closed-loop sequence may need to be performed at a relatively rapid rate such as, for example, once every fifty microseconds or less.

In one conventional approach, several ADCs are provided so that the several ADCs can measure the required voltages and currents in parallel at the same time. This is generally a quite expensive solution due to the cost of providing multiple ADCs.

In another conventional approach, the microcontroller includes a single but relatively fast ADC. This ADC takes samples at the rate of, for example, one sample every microsecond. Samples are taken one at a time in series but due to the speed of the ADC the time delay between samples is acceptable. Due to the serial sampling, however, there remains less time for the processor to do the necessary processing on the samples before the end of the control loop cycle. In addition, the processor is generally interrupted after each ADC conversion is performed. In response to being interrupted, the processor switches contexts, reads the result of the ADC, stores the result, then starts the ADC in performing the next analog to digital conversion, and then switches contexts back in order to resume the processing task that it was performing before it was interrupted. Because these interruptions consume processing cycles, a relatively fast processor may be required in order to perform the processor's computational tasks in the time remaining. Providing the fast ADC and the fast processor may be undesirably expensive for some cost sensitive applications.

In another conventional approach, a DMA controller is provided in a Von Neumann architecture in order to offload the processor of the task of having to service the ADC. The DMA controller, however, competes with the processor for use of the main bus. Bus contention introduces unwanted complexities into the design of the control loop software. In addition, the DMA controller is often a large circuit and providing the DMA controller along with any necessary bus arbiter increases the size of the microcontroller die. A Harvard architecture can be employed so that the DMA controller can service the ADC over a second bus while the processor has uncontested use of the main bus, but providing such a Harvard architecture with the extra bus is also undesirably expensive.

SUMMARY

A packaged controller includes a first semiconductor die and a second semiconductor die that are packaged together in a semiconductor package. The first semiconductor die is manufactured using a first semiconductor fabrication process that is particularly suited to making digital logic and digital circuits, whereas the second semiconductor die is fabricated using a second semiconductor fabrication process that is particularly suited to making analog circuitry. The first die (the digital die) includes a processor, a first terminal (ASIG), a second terminal (SDATA), an analog-to-digital converter (ADC), a serial bus interface, and a sequencer. The second die (the analog die) includes a serial bus interface, a first terminal (ASIG), a plurality of sample/hold circuits, an analog multiplexer, and a second terminal (SDATA).

In response to a trigger signal, the sequencer on the first die causes a multi-bit value to be communicated in serial fashion across a low latency unidirectional serial link from the serial bus interface of the first die, across the second terminal (SDATA) of the first die, across the second terminal (SDATA) of the second die, and to the serial bus interface on the second die. The serial bus interface of the first die also outputs a serial bus clock SCLK to the serial bus interface of the second die to control the clocking of individual bits of the multi-bit value into a set of flip-flops in the second bus interface.

The system is programmable by the processor so that in response to receiving at least part of the multi-bit value onto the second die, the serial bus interface of the second die causes a sample/hold signal (S/H) supplied to the plurality of sample/hold circuits to be asserted. The multi-bit value also controls the analog multiplexer on the second die so that a voltage output by a selected one of the sample/hold circuits on the second die is coupled through the analog multiplexer onto the first terminal (ASIG) of the second die, and over to the first terminal (ASIG) of the first die, and onto an input lead of the ADC in the first die. Once the analog multiplexer is properly set by this mechanism, the sequencer causes the ADC to perform an analog-to-digital conversion, thereby generating an ADC output value. The AC output value is then written under control of the sequencer into a data buffer. By sending multiple such multi-bit values across the serial bus to the second die, multiple sample voltages that were captured at one time in the set of sample/hold circuits can be coupled, one by one, onto the input lead of the ADC in the first die for analog-to-digital conversion. The resulting set of ADC output values is stored into the data buffer. The sequencer may be programmed so that after these ADC output values have been stored in the data buffer, the sequencer then outputs an interrupt signal. The processor, once interrupted, can then read the ADC output values out of the data buffer in one efficient read process.

A latency period between the time when the trigger signal is asserted until the time when the sample/hold signal is asserted is less than eight periods of the serial bus clock signal SCLK. A latency period between the time when the trigger signal is asserted until the first bit value of the multi-bit value is output from the first die is less than approximately two periods of SCLK. These two low latency periods and the offloading of the processor of the task of having to manage a sequence of analog-to-digital conversions allows a relatively lower performance and lower cost processor to be employed and simplifies the writing of control loop software.

The sequencer includes a set of sequencer registers that are writable by the processor. The contents of each such sequencer register contains control and configuration information that determines how an associated ADC sample is to be taken. For example, one field of a sequencer register contains the multi-bit value that will be sent across the low latency serial bus interface to the second die in order to set up the analog multiplexer in the analog die and in order to assert the sample/hold signal as desired for the ADC conversion to be done. Once triggered, the sequencer steps through these sequencer registers and causes the indicated operations to be performed, one by one, until the last sequencer register that stores a legitimate sequencer register value has been handled. After the last sequencer register value has been handled, then the sequencer asserts the interrupt signal.

The foregoing is a summary and thus contains, by necessity, simplifications, generalizations and omissions of detail; consequently is it appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
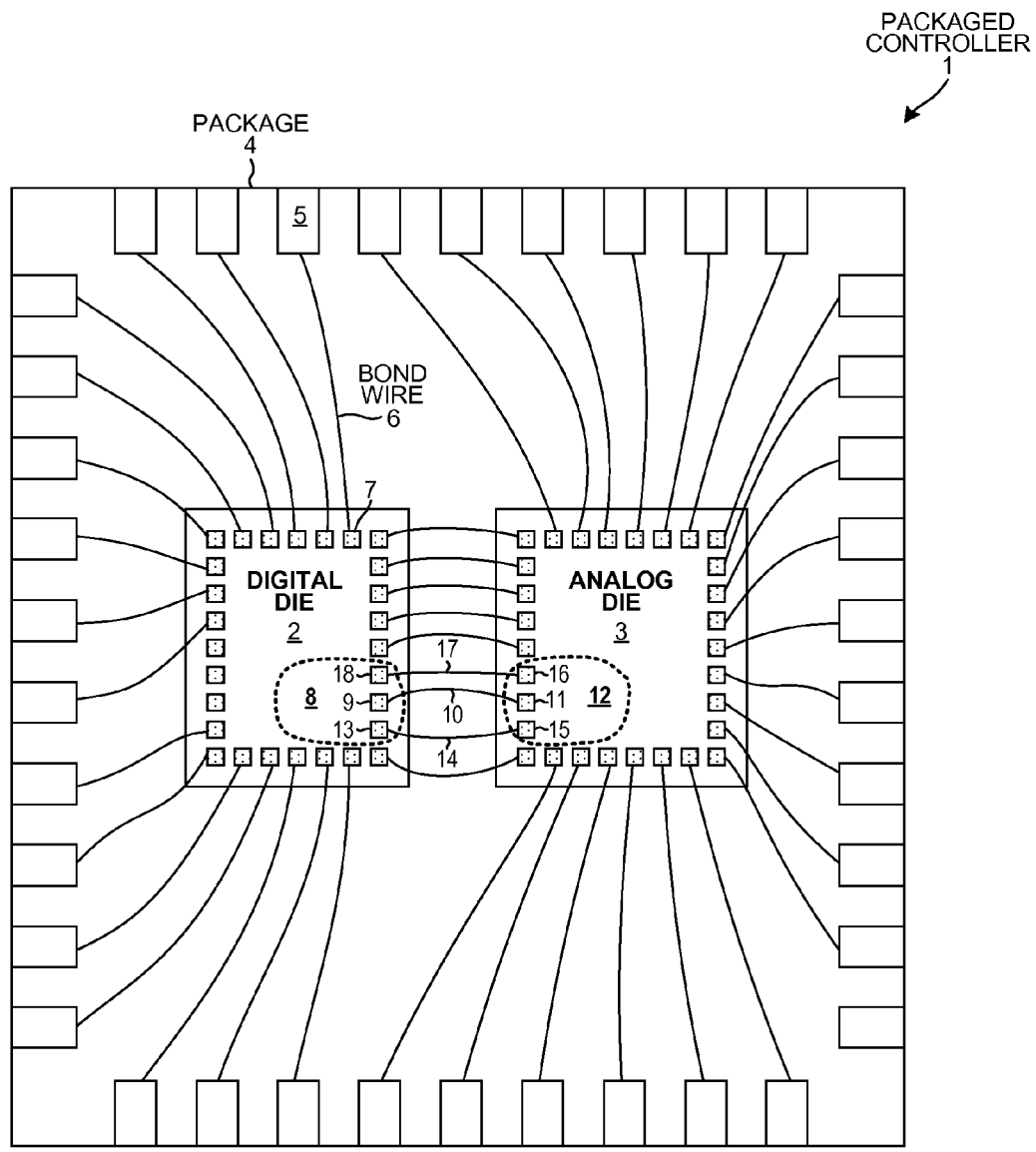
FIG. 1 is a simplified top-down conceptual diagram of a packaged controller 1 in accordance with one novel aspect.

FIG. 1 is a simplified top-down conceptual diagram of a packaged power management controller circuit 1 in accordance with one novel aspect. Packaged controller 1 includes a first integrated circuit die 2 and a second integrated circuit die 3 that are disposed within an integrated circuit package 4. The integrated circuit package 4 may be any suitable type of package. In the illustrated example, package 4 is a quad flat pack package that has no leads. Package 4 has package terminals disposed in a ring that extends around the periphery of the package. Reference numeral 5 identifies one such package terminal. Reference numeral 6 identifies a bond wire that connects a bond pad 7 on first die 2 to package terminal 5. Bond pads such as bond pad 7 are also referred to as die terminals. The diagram of FIG. 1 is a simplification. Details of the lead frame and how the bond wires connect to the lead frame are not shown.

Each of the first die 2 and the second die 3 is pad limited. The dice are pad limited in that the size of each die is limited by the bond pads disposed around the periphery of the die and not by the semiconductor surface area occupied by the functional circuitry within the peripheral ring of pads. Although the pad limited problem could be avoided by employing flip-chip attach methods, conventional bond pads and wire bonds are employed in order to use more conventional and less expensive processes.

First die 2 is fabricated using a first semiconductor fabrication process that is particularly suited to making digital logic and digital circuits and memories. Second die 3 is fabricated using a second semiconductor fabrication process that is particularly suited to making analog circuitry. Although a single semiconductor fabrication process such as a BiCD-MOS process could be used to realize the circuitry of both dice onto a single die, a single die solution using such a process is not used. Cost and performance advantages associated with using the first semiconductor fabrication process to make most of the digital circuitry of the controller are exploited by segregating most of the digital circuitry onto the first die and then manufacturing that die using a fabrication process better suited to making digital circuitry. Similarly, cost and performance advantages associated with using the second semiconductor fabrication process to make most of the analog circuitry of the controller are exploited by segregating most of the analog circuitry onto the second die and then manufacturing that die using a fabrication process better suited to making analog circuitry.

Due to the pad limited nature of the dice 2 and 3 of packaged controller 1, a novel low latency serial bus is employed to reduce the number of connections between the first and second dice. First circuitry 8 on the first die 2 sends control information serially via die terminal 9, bond wire 10, and die terminal 11 to second circuitry 12 on second die 3. First circuitry 8 also sends a serial bus clock signal via die terminal 13, bond wire 14, and die terminal 15 to the second circuitry 12. The control information communicated from the first die to the second die via this serial bus is used on the second die to control when the sample/hold circuitry on the second die performs sampling, and to control how an analog multiplexer on the second die multiplexes analog sample signals onto a single terminal of the second die for communication back to an ADC on the first die. In the illustration of FIG. 1, the analog sample signals are communicated back through die terminal 16, through bond wire 17, through die terminal 18, and to the ADC in first circuitry 8.

Figure 2A:
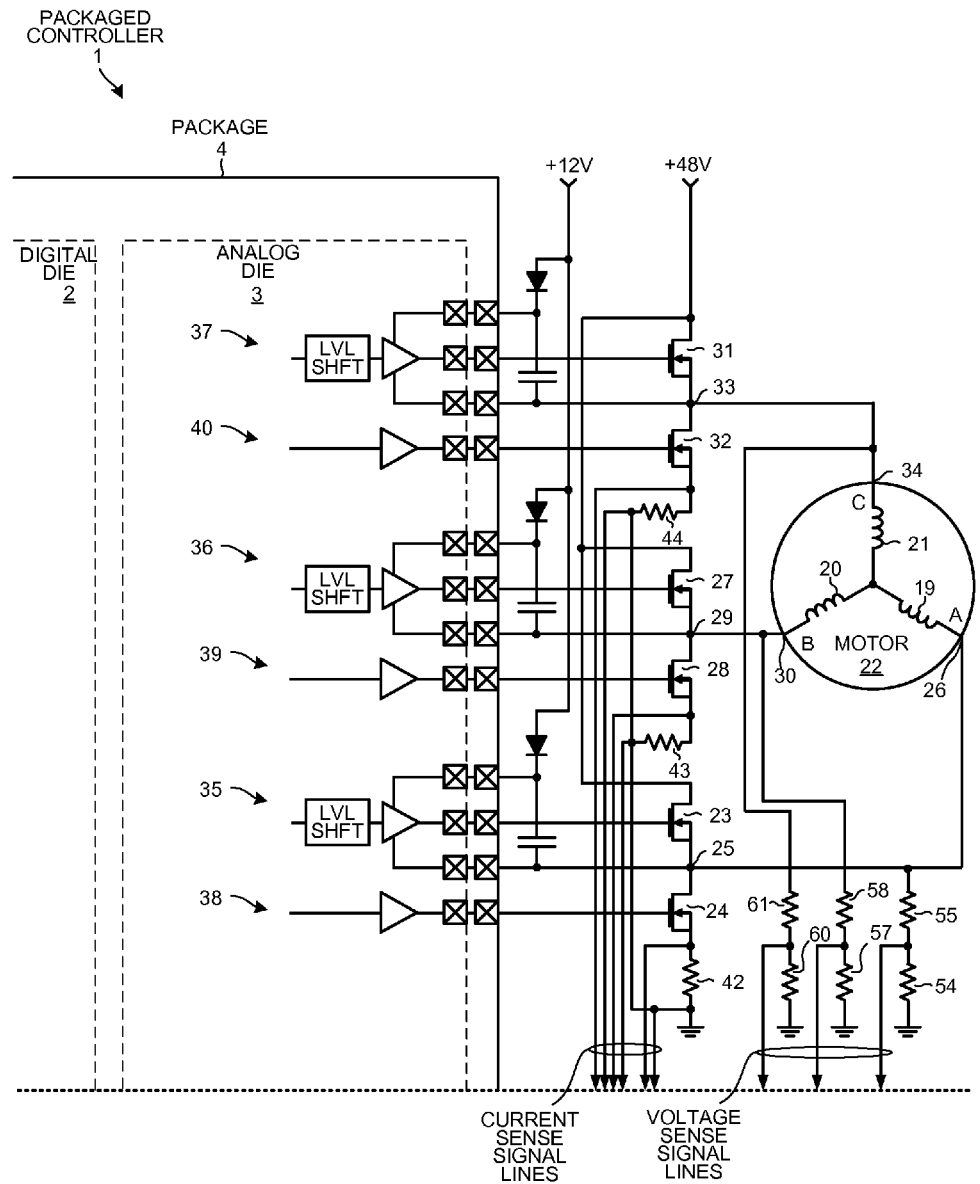
FIG. 2 is a simplified diagram that illustrates a use of the packaged controller 1 of FIG. 1 in a motor control application.
Figure 2B:
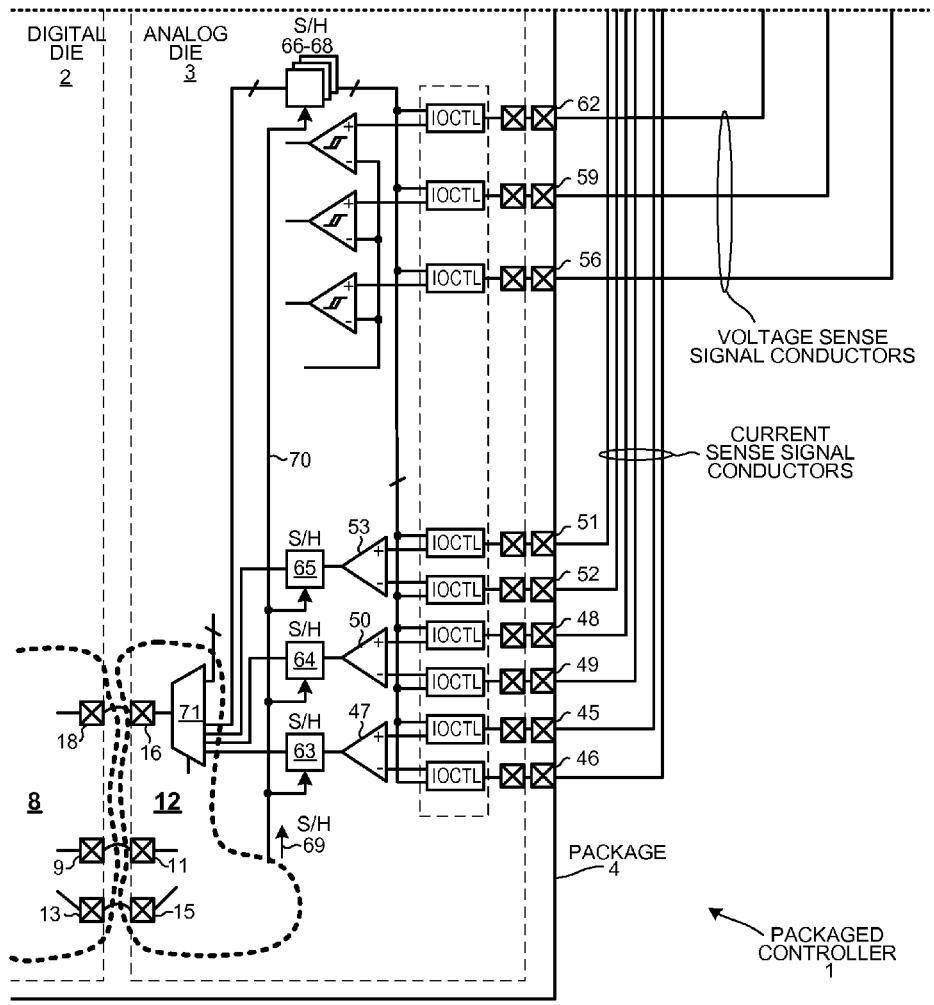

FIG. 2 is a simplified diagram that illustrates the packaged controller 1 of FIG. 1 in a motor control application involving a fifty microsecond control loop cycle. Detail of digital die 2 is omitted so that more detail of analog die 3 can be shown. Packaged controller 1 controls currents that are driven through the three windings 19, 20 and 21 of motor 22 as appropriate to drive the motor. A first pair of high-side and low-side external field effect transistors (FETs) 23 and 24 is coupled to common node 25 and motor terminal 26. A second pair of high-side and low-side external FETs 27 and 28 is coupled to common node 29 and motor terminal 30. A third pair of high-side and low-side external FETs 31 and 32 is coupled to common node 33 and motor terminal 34. High-side driver circuits 35, 36 and 37 drive the external high-side FETs 23, 27 and 31, respectively. Low-side driver circuits 38, 39 and 40 drive the external low-side FETs 24, 28 and 32, respectively. A processor 41 (see FIG. 3) on digital die 2 controls the high-side and low-side circuit circuits by writing digital values into an associated register (not shown) on the second die. The digital bit values stored in the various bit positions of the associated register determine whether the associated high-side and low-side drivers are driving their external FETs to be on or off. Current can be made to flow from the +48 volt supply conductor, into a selected motor terminal, through two windings of the motor, and out of a selected other motor terminal, and to a ground conductor.

The currents flowing out of the motor terminals 26, 30 and 34 are made to flow across corresponding sense resistors 42, 43 and 44. The voltage drop across resistor 42 is sensed using package terminals 45 and 46 and differential amplifier 47. The voltage drop across resistor 43 is sensed using package terminals 48 and 49 and differential amplifier 50. The voltage drop across resistor 44 is sensed using package terminals 51 and 52 and differential amplifier 53.

In addition to sensing currents, the packaged controller 1 senses the voltages on the three motor terminals 26, 30 and 34. The voltage on motor terminal 26 is divided down by resistive voltage divider 54 and 56, with the resulting divided down voltage being sensed on package terminal 56. The voltage on motor terminal 30 is divided down by resistive voltage divider 57 and 58, with the resulting divided down voltage being sensed on package terminal 59. The voltage on motor terminal 34 is divided down by resistive voltage divider 60 and 61, with the resulting divided down voltage being sensed on package terminal 62.

Analog die 3 includes a sample/hold circuit for sampling the voltage output by each of the differential amplifiers 47, 50 and 53. Similarly, there is a sample/hold circuit for sampling the voltage on each of package terminals 56, 59 and 62. Reference numerals 63-69 identify these six sample/hold circuits. All six sample/hold circuits are controlled by a common sample/hold signal 69 that is supplied to the sample/hold circuits via the same conductor 70. When the sample/hold signal 69 has a digital logic low level, then the analog voltage signal on the input lead of a sample/hold circuit passes through the sample/hold circuit to the output lead of the sample/hold circuit. When the sample/hold signal 69 transitions from a digital logic low level to a digital logic high level, then the sample/hold circuit captures and holds the voltage present on its input lead. The voltage being output from the sample/hold circuit does not change until the sample/hold signal 69 returns to the digital logic low level. This circuitry is used to capture simultaneously six voltages: three voltages indicative of the currents flowing through the three windings of the motor, and three voltages indicative of the voltages on the three winding terminals of the motor. These six captured voltages are output simultaneously by the six sample/hold circuits 63-68 onto six corresponding data input leads of analog multiplexer 71. Analog multiplexer 71 is usable to couple a selected one of these captured voltage signals back to an ADC on the first die via a single terminal 16 (ASIG) of the second die, via a bond wire connection 17, and via a single terminal 18 (ASIG) of the first die.

Figure 3:
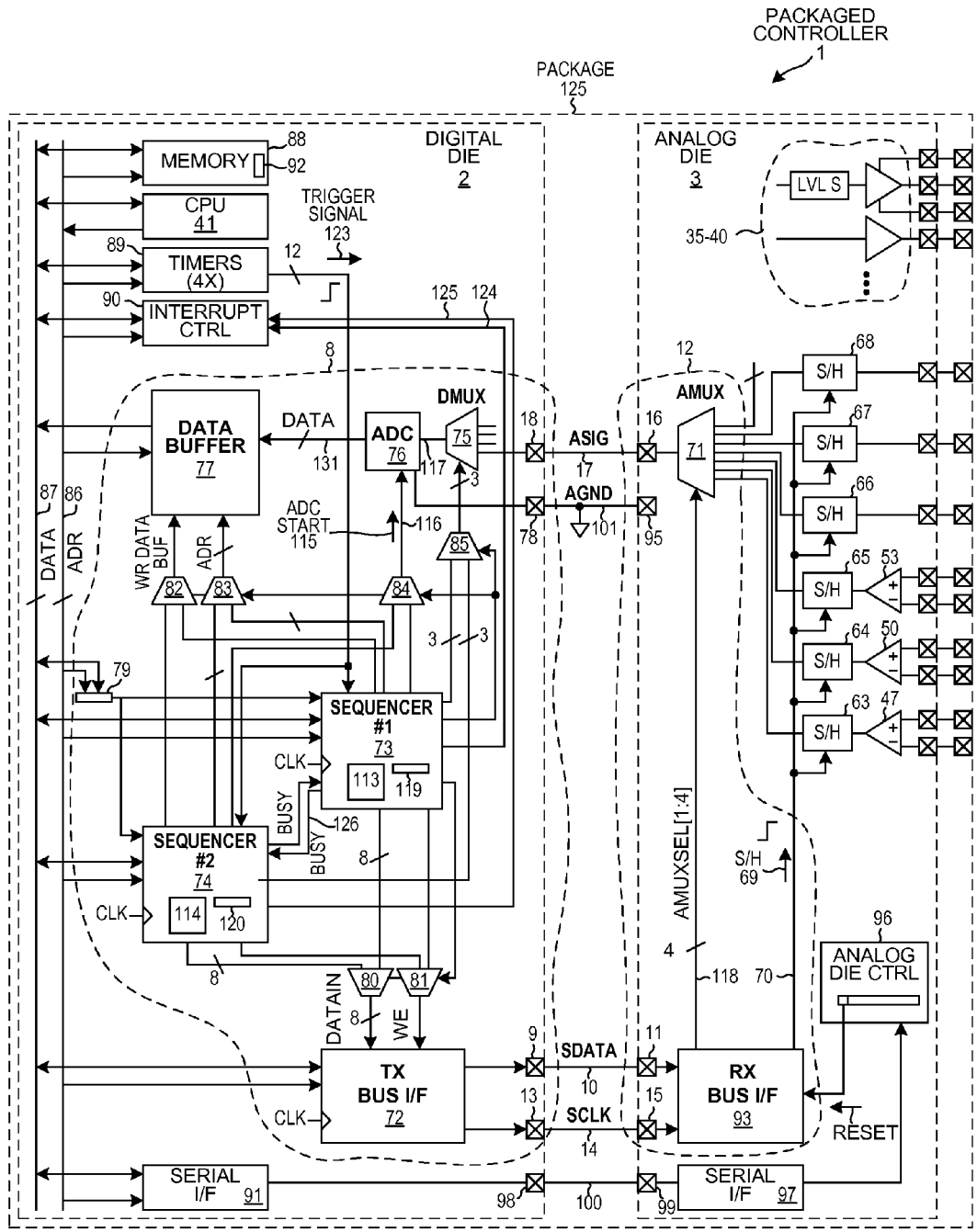
FIG. 3 shows the first circuitry 8 of first die 2 and the second circuitry 12 of second die 3 in more detail.

FIG. 3 shows the first circuitry 8 of first die 2 and the second circuitry 12 of second die 3 in more detail. First circuitry 8 includes a serial bus interface 72, a first sequencer 73, a second sequencer 74, an analog multiplexer (denoted DMUX because it is a multiplexer on the digital die) 75, an analog-to-digital converter 76, a data buffer 77, die terminals 9, 13, 18 and 78, a sequencer mode control register 79, and multiplexing circuits 80-85. Processor 41 is the only master of a local bus involving an address bus 86 and a data bus 87. Processor 41 fetches and executes instructions of control loop software 92 stored in processor-readable memory 88. In this Von Neumann architecture, there is only one bus (the local bus 86,87) coupling processor 41, program and data memory 88, and first circuitry 8. Moreover, processor 41 is the only master of the local bus. Processor 41 can read from and write to memory 88, timer/PWM block 89, interrupt controller 90, data buffer 77, sequencer mode control register 79, sequencers 73 and 74, serial bus interface 72, and a second serial bus interface 91 (for example, I2C or SPI) across the local bus 86, 87.

Second circuitry 12 includes a serial bus interface 93, analog multiplexer 71 (denoted AMUX because it is the multiplexer on the analog die), and die terminals 11, 15, 16 and 95. In addition to second circuitry 12, the second die 3 includes the high-side and low-side drivers 35-40, the sample/hold circuits 63-68, the differential amplifiers 47, 50 and 53, numerous other die terminals (not numbered), analog die control logic 96, and a second serial bus interface 97. The second serial bus interface 91 of digital die 2 and the second serial bus interface 97 of analog die 3 together provide a second serial link across terminals 98 and 99 between dice 2 and 3. This second serial link employs a standard serial protocol such as, for example, I2C or SPI. Inter-die connections are provided by bond wires 17, 101, 10, 14 and 100. In another example, the inter-die connections are not bond wires but rather are conductors that are part of package 4.

Figure 4:
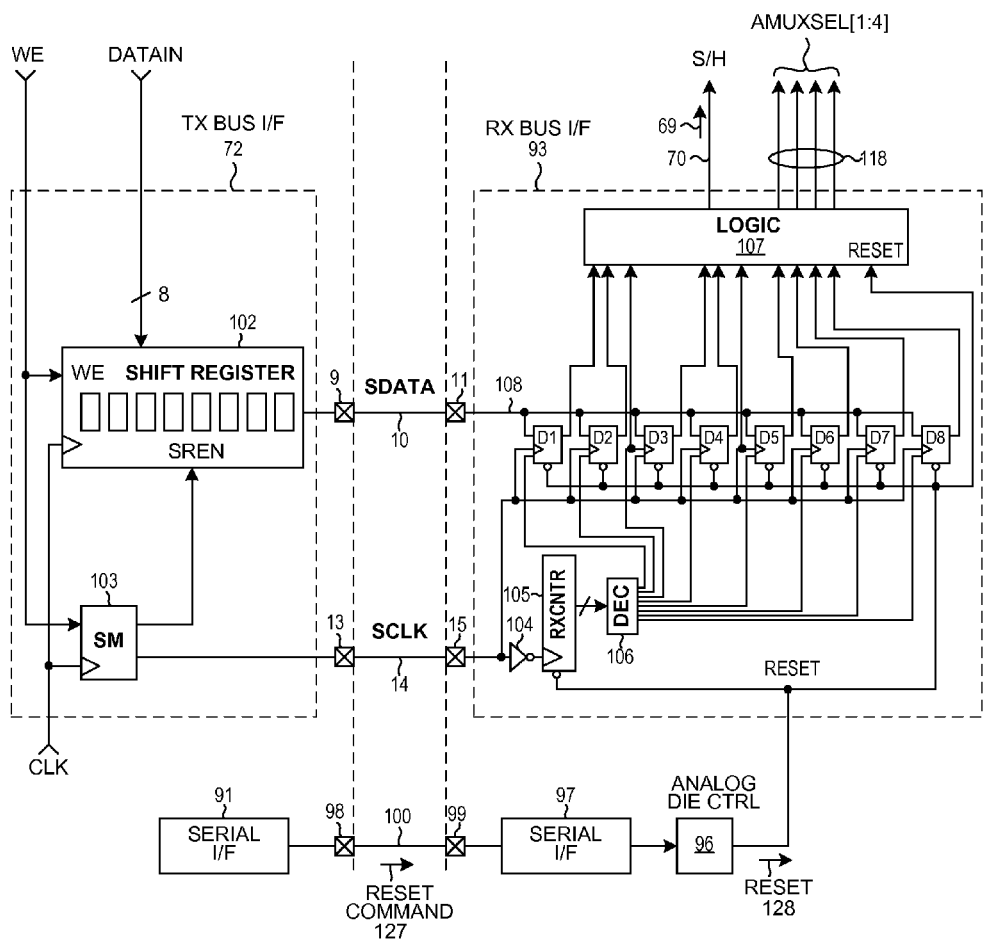
FIG. 4 is a more detailed circuit diagram of the serial bus interface 72 of the first die 2 and of the serial bus interface 93 of the second die 3.

FIG. 4 is a more detailed circuit diagram of the serial bus interface 72 of the first die 2 and of the serial bus interface 93 of the second die 3 (the circuit diagram of FIG. 4 includes simplifications and is presented here in simplified form for instructional and illustrative purposes). Serial bus interface 72 of first die 2 includes a shift register 102 and a state machine 103. One of the sequencers 73 or 74 can write an 8-bit DATAIN value in parallel into the shift register 102 synchronously with respect to the clock signal CLK. If the write enable signal WE is high at the time of a rising edge of CLK, then the 8-bit DATAIN value is parallel-loaded into the shift register regardless of the signal being received onto the shift enable SREN input lead. If WE is low, then the shift register will shift on a rising edge of the clock CLK if SREN is asserted high at the time of the rising edge of the clock CLK. In the illustration, the eight bits of the shift register 102 are shifted left to right, with the rightmost bit being output from the shift register onto die terminal 9. The state machine 103 supplies a associated serial bus clock signal SCLK to the second die 3 via die terminal 13, wire bond connection 14, and die terminal 15.

In the simplified illustration of FIG. 4, the serial bus interface 93 of the second die 3 includes eight flip-flops (denoted D1 through D8 in the illustration), an inverter 104, a 3-bit counter RXCNTR 105, a decoder DEC 106 and logic block LOGIC 107. If counter 105 is in the 000 state then decoder 106 supplies an enable signal to flip-flop D1 but to no others of the flip-flops. Likewise, if counter 105 is in the 001 state then decoder 106 supplies an enable signal to flip-flop D2 but to no others of the flip-flops. Similarly, if counter 105 is in the 010 state then decoder 106 supplies an enable signal to flip-flop D3 but to no others of the flip-flops, and so forth. Flip-flops D1-D8 do not form a shift register and SDATA bits are not shifted into the second die, but rather the individual flip-flops D1-D8 are individually enabled and loaded with data one at a time depending on the state of RXCNTR 105.

Initially, the RXCNTR counter is in the 000 state (state 1) but SCLK is not clocking so none of the flip-flops D1-D2 is loading any data. The serial bus interface 72 of the first die 2 then outputs a data bit value from the rightmost bit of shift register 102. This bit is supplied to the data input leads of all the flip-flops D1-D8 via conductor 108. Only flip-flop D1 is, however, enabled. On the falling edge of signal CLK, the serial bus interface 72 asserts the SCLK signal high that in turn clocks the data bit value into flip-flop D1. The next rising edge of CLK causes the next data bit to be shifted out of shift register 102. On this rising edge of signal CLK, the serial bus interface 72 deasserts the SCLK signal low which in turn causes the RXCNTR counter 105 to increment to the 001 state (state 2). This incrementing causes decoder 106 to enable the second flip-flop D2. Accordingly, on the next rising edge of SCLK, the second data bit is clocked into the second flip-flop D2. In this way, each successive bit of the 8-bit DATAIN value is shifted out of shift register 102, through the second die terminal (SDATA) 9 of the first die, across inter-die connection 10, through the second die terminal (SDATA) 11 of the second die, and is clocked into a corresponding one of the flip-flops D1-D8 on second die 3. The state machine 103 stops toggling the SCLK signal once all eight bits have been clocked into the flip-flops of the second die 3.

Figures 5, 6:
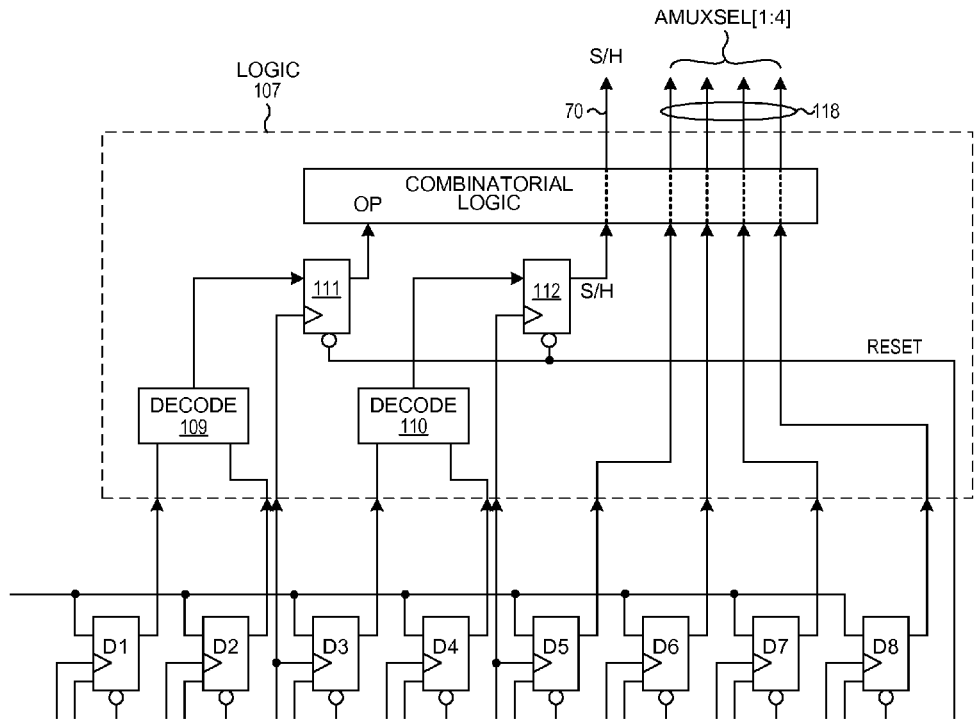
FIG. 5 is a more detailed diagram of the logic block 107 of FIG. 4.
FIG. 6 is a table that sets forth an operation of the combinatorial logic block 107 of FIG. 4.

FIG. 5 is a more detailed diagram of the logic block 107 of FIG. 4. The values stored in the first two bits (in the D1 and D2 flip-flops) indicate the meanings of the remaining six bit values of DATAIN. As indicated in the table of FIG. 6, in the illustrated example the only used combination of bit values for D1 and D2 is 01. The other combinations of D1 and D2 are reserved and unused in this example.

If the values of these two bits D1 and D2 are 01, then the value of the third bit of the DATAIN value is to be supplied onto conductor 70 as the S/H signal 69. If the value stored in flip-flop D3 is a digital logic high then the S/H signal 69 is to have a digital logic high value, whereas if the value stored in flip-flop D3 is a digital logic low then the S/H signal 69 is to have a digital logic low value. The values of the last four bits of the DATAIN value are to be output from logic block 107 as multiplexer control signal AMUXSEL[1:4]. AMUXSEL[1:4] is supplied onto the four conductors 118 that extend to four select input leads of AMUX multiplexer 71. To prevent unwanted glitching of the S/H signal 69, the operation indicated by the first two bits D1 and D2 is decoded to be valid at the time of the third rising edge of SCLK. The third rising edge of SCLK occurs after the D1 and D2 flip-flops have both clocked in their respective bit values of the DATAIN value. The value of the third bit in D3 is latched and output onto the S/H conductor 70 on the fifth rising edge of SCLK. Decoders 109 and 110 and flip-flops 111 and 112 ensure that the S/H signal 69 can only change at one time during the serial communication operation after the value stored in the corresponding D3 flip-flop is stable.

One of the sequencers 73 or 74 can use this low latency serial bus interface to cause S/H signal 69 to be asserted so that all six sample/hold circuits 63-68 simultaneously perform sample and hold operations. If initially the logic value of S/H signal 69 is low, then the sequencer can load the serial bus interface 72 with a DATAIN value whose third bit value is a digital logic high. When the third bit of the DATAIN value is clocked into the third flip-flop D3 of the second die, then the S/H signal 69 will transition from low to high, thereby causing the six sample/hold circuits 63-68 to hold.

In addition, a sequencer can change the value of AMUX-SEL[1:4]. The sequencer may, for example, send multiple 8-bit DATAIN values to analog die 3, where the last four bit values of the DATAIN values change so that one by one the analog sample voltages held in the various sample/hold circuits are multiplexed out through terminal ASIG 16, across inter-die connection 17, through terminal ASIG 18, and to the ADC 76 in the digital die. The analog sample voltages passing between the dice across inter-die connection 17 are single-ended signals, whose voltages are relative to analog ground potential AGND on die terminals 95 and 78.

Figure 7:
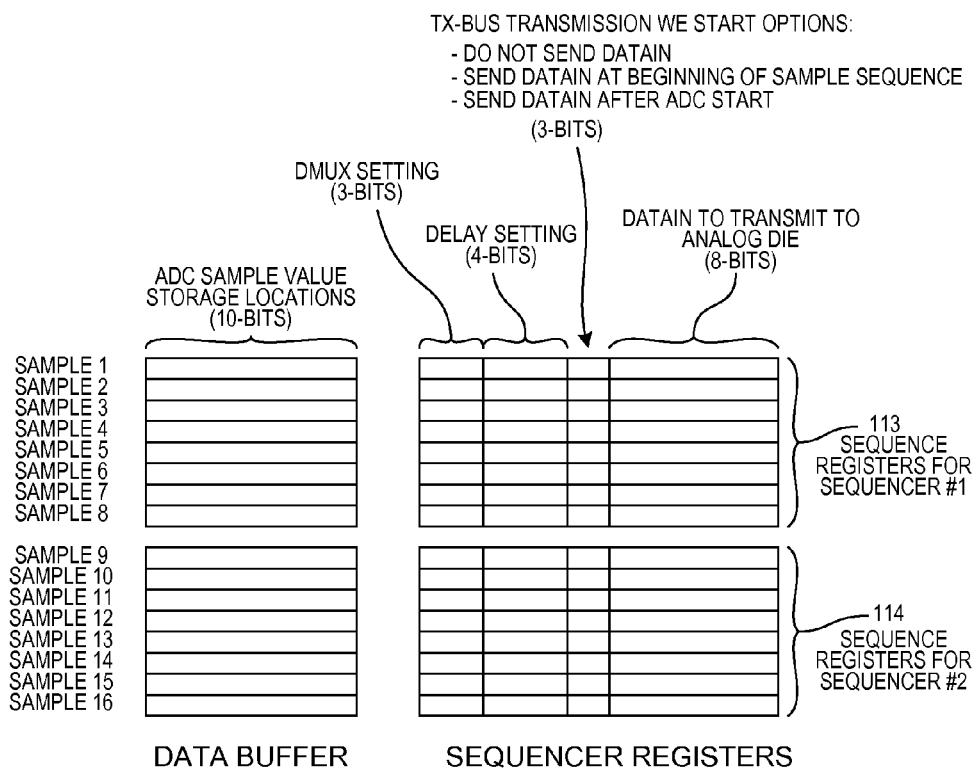
FIG. 7 is a diagram that illustrates the eight sequencer registers for sequencer 73, the eight sequencer registers for sequencer 74, the eight locations in the data buffer for holding ADC output values for sequencer 73, and the eight locations in the data buffer for holding ADC output values for sequencer 74.

As indicated in FIG. 7, each of the sequencers 73 and 74 has its own set of eight associated sequencer registers. In FIGS. 3 and 7, reference numeral 113 identifies the eight sequencer registers of sequencer 73. Reference numeral 114 identifies the eight sequencer registers of sequencer 74. Each sequencer registers has multiple fields as indicated in FIG. 7. In operation, a sequencer steps through its sequencer registers one at a time, using the contents of the sequencer register to set DMUX 75 and to set AMUX 71. Note that the first 3-bit field of a sequencer register holds a 3-bit DMUX setting value for controlling DMUX 75. Note that the last eight bits of a sequencer register hold an 8-bit DATAIN value (of which the last four bits are an AMUXSEL[1:4] setting value for controlling analog multiplexer 71 as described above). The level of the S/H signal is determined by the value of the third bit of the DATAIN value.

After the S/H signal has been changed as desired and after the select signals supplied to the DMUX and AMUX multiplexers have been set up as desired, then the sequencer initiates ADC 76 in performing an analog-to-digital conversion by asserting a start converter signal START ADC 115 on conductor 116. In response, ADC 76 converts the analog voltage signal present on its analog input lead 117 into a corresponding multi-bit digital ADC output value on conductors 118. ADC 76 has its own sample and hold circuit so once START ADC signal 115 has transitioned, the analog signal on the ADC input lead 117 can be changed without affecting the ongoing analog-to-digital conversion being performed by the ADC. After the analog-to-digital conversion has been completed, the sequencer then causes the ADC output value on conductors 131 to be written into the appropriate 10-bit location in data buffer 77. In the representation of the table of FIG. 7, the ADC output value that results from using the settings of an entry in a sequencer register is written into the 10-bit location in the data buffer that is on the same row as the sequencer register. The sequencer registers and the 10-bit locations in the data buffer are in a one-to-one relation. The processor 41 can set up the contents of the sequencer registers by writing across data bus 86, 87 into the sequencers and thereafter starting the sequencers by sending them appropriate trigger signals. Because processor 41 programs the sequencer registers in this way, and because the corresponding 10-bit locations in the data buffer where the ADC output values will be written are predetermined and known to processor 41, the processor 41 can later read the ADC output values from the data buffer via data bus 86, 87.

Figure 8:
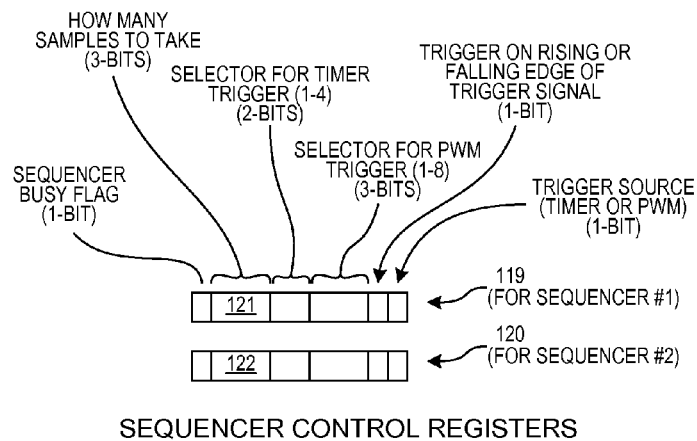
FIG. 8 is a diagram illustrating the various fields of a sequencer control register.

FIG. 8 is a diagram that illustrates the various fields of a sequencer control register. Each of the two sequencers has one such sequencer control register. Sequencer control register 119 is the sequencer control register for sequencer 73. Sequencer control register 120 is the sequencer control register for sequencer 74. The value stored in field 121 indicates how many of the sequencer registers 113 of the first sequencer 73 contain legitimate entries. Similarly, the value stored in field 122 indicates how many of the sequencer registers 114 of the second sequencer 74 contain legitimate entries. After being triggered by a trigger signal, a sequencer proceeds through its sequencer registers, one by one, until all its sequencer registers that store legitimate values have been serviced. When all sequencer registers have been serviced, then the sequencer asserts an interrupt signal to interrupt controller 90. The first sequencer 73 sends its interrupt signals via conductor 124 and the second sequencer 743 sends its interrupt signals via conductor 125. Upon being interrupted by a sequencer, the processor 41 reads the associated locations in data buffer 77 via data bus 86, 87, thereby retrieving the ADC output values written there by the sequencer.

Figure 9:
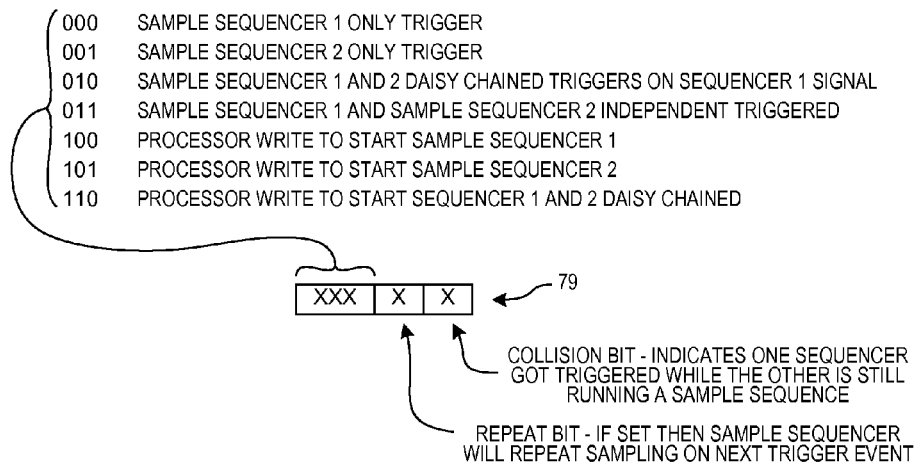
FIG. 9 is a diagram illustrating the various fields of the sequencer mode control register.

FIG. 9 is a diagram that shows the three fields of the sequencer mode control register 79 of FIG. 3. For example, if the first 3-bit field of the sequencer mode control register 79 stores the value 000, then only the first sequencer 73 is operational and that sequencer proceeds through its sequencer register values in response to receiving a trigger signal. Values in the sequencer control register 119 for the first sequencer 73 determine which one of multiple timer/PWM output signals will be used as the trigger signal. Another bit value in the sequencer control register 119 determines whether a rising edge of the trigger signal will start the sequencer or whether a falling edge of the trigger signal will start the sequencer. In the example of FIG. 3, sequencer 73 is configured to trigger on a rising edge of trigger signal 123. Trigger signal 123 is one of twelve signals output by the timers and PWM block 89.

Figure 10:
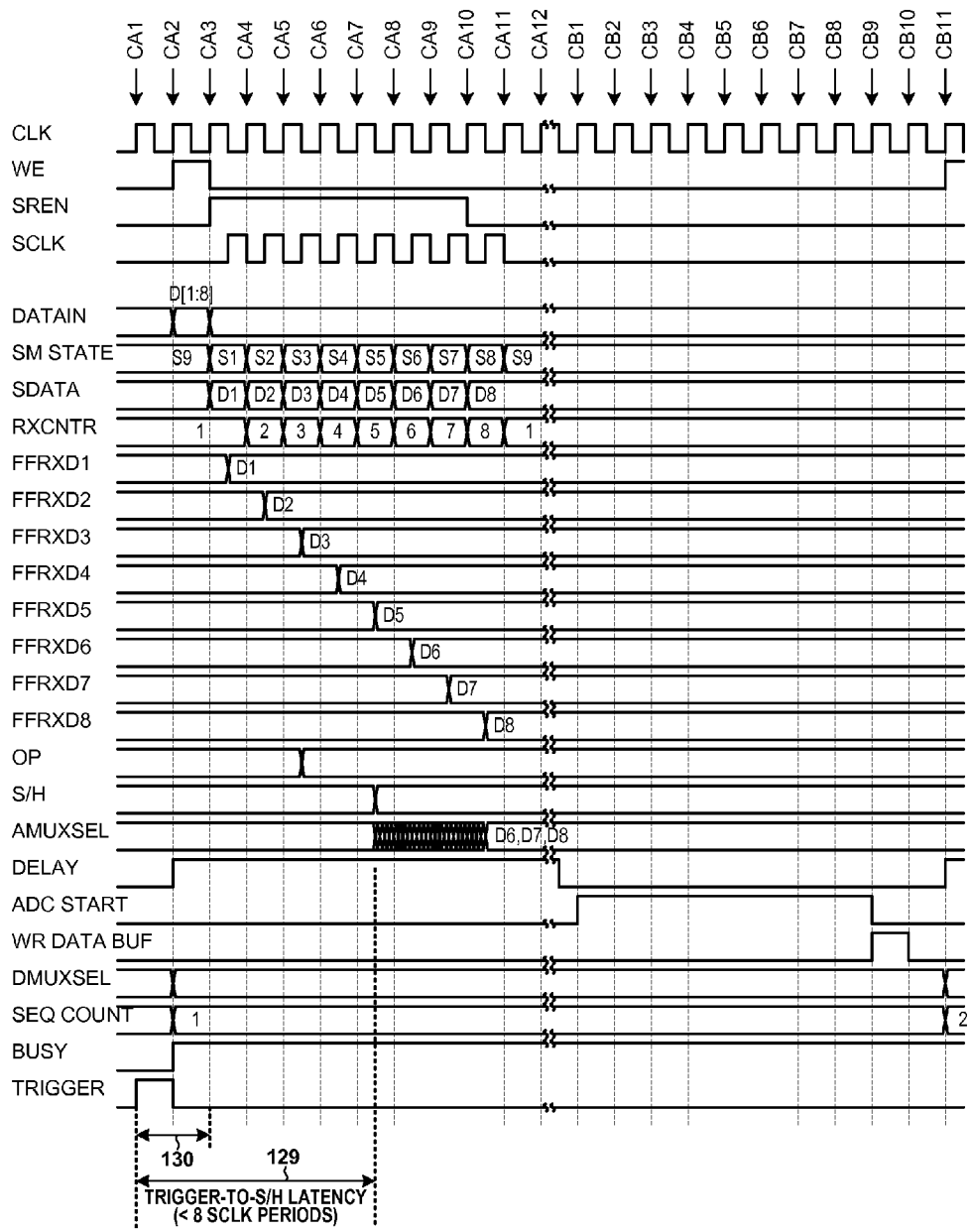
FIG. 10 is a simplified waveform diagram illustrating an operation involving sequencer register contents where the "TX-BUS TRANSMISSION WE START OPTIONS" field bits are set to the "SEND DATATIN AT BEGINNING OF SAMPLE SEQUENCE" option.

FIG. 10 is a simplified waveform diagram illustrating an operation involving sequencer register contents where the 3-bit "TX-BUS TRANSMISSION WE START OPTIONS" field bits are set to the "SEND DATATIN AT BEGINNING OF SAMPLE SEQUENCE" option. In the illustrated example, the sequencer register is the first sequencer register for sequencer 73. The sequencer mode control register 79 is set so that only sequencer 73 is used. Sequencer control register 119 for sequencer 73 is set so that the sequencer will trigger on the rising edge of trigger signal 123. CLK is 50 MHz and the period of SCLK is 20 ns. Within one SCLK period of the timer block 89 asserting the trigger signal 123 high, a rising edge of CLK occurs. In response, sequencer 73 asserts its BUSY signal on conductor 126, enters its sequence count "1" state, outputs the DMUXSEL values to DMUX 75, starts a delay timer, supplies the 8-bit DATAIN value to serial bus interface 72, and asserts the write enable signal WE high. On the next rising edge of the signal CLK, the DATAIN value is loaded in parallel fashion into shift register 102. The state machine 103 transitions from its S9 state to its S1 state and asserts the shift enable SREN signal. Due to the DATAIN value being present in shift register 102, the D1 bit of the DATAIN value is output by the shift register 102 onto second die terminal (SDATA) 9. The latency period between the asserting of the trigger signal 69 and the outputting of the D1 bit onto second die terminal 9 is less than two periods of the serial bus clock signal SCLK.

Half a CLK period later, the state machine 103 asserts the SCLK signal high for the first time. This rising edge of SCLK causes the digital value D1 on terminals 9 and 11 to be written into flip-flop D1 in the analog die 3. On the next rising edge of CLK, the shift register shifts, the D2 value of DATAIN is present on terminal 9. One half clock period later the D2 value is clocked into flip-flop D2. After the first two bit values of DATAIN have been clocked into the flip-flops D1 and D2 in this way, the output of decoder 109 (see FIG. 5) stabilizes. On the next falling edge of CLK, the decoder output value is clocked into flip-flop 111. This is indicated in the waveform diagram of FIG. 10 by the changing of the operation signal OP half a clock cycle after rising CLK edge CA5. Similarly, after the loading of the third and fourth bit values of DATAIN into D3 and D4, the output of decoder 110 (see FIG. 5) stabilizes. On the next falling edge of CLK, the decoder output value is clocked into flip-flop 112. This is indicated in the waveform diagram of FIG. 10 by the changing of the S/H signal half a clock cycle after CLK edge CA7. After all eight bit values are loaded into flip-flops D1-D8, then the AMUX-SEL[1:4] values are stable. In the waveform of FIG. 10, this occurs approximately half a clock cycle after rising CLK edge CA10. State machine 103 advances from state to state as the bit values of DATAIN are shifted out of shift register 102, but once the last bit value has been shifted out then the state machine 103 deasserts the shift enable signal SREN. Similarly, after the last bit value has been clocked into flip-flop D8, then the state machine 103 stops the SCLK signal from changing levels. Accordingly, both the shift register 102 stops shifting and none of flip-flops D1-D8 is enabled to clock in new data. The signals being output by flip-flops D1-D8 do not change.

The internal signal DELAY transitions low after a number of clock cycles determined by the 4-bit DELAY SETTING field of the sequencer register value. The sequencer detects this internal signal being a low value, and in response on the next rising edge of CLK asserts ADC START signal 115. As described above, this starts the ADC performing an analog-to-digital conversion. Whether the DATAIN value resulted in the asserting of the S/H signal (such that the sample/hold circuits captured new samples) is determined by whether the value of the S/H signal was made to transition high. How DMUX 75 is set is determined by the value of the DMUX setting field of the sequencer register value. How the analog multiplexer 71 is set is determined by the values of last four bits of DATAIN.

After a number of clock cycles amounting to about one microsecond, the ADC outputs an ADC output value onto conductors 131. On rising CLK edge CB9 the sequencer asserts the WR DATA BUF signal along with an associated address value. These signals are provided to the data buffer 77 via multiplexers 82 and 83. As a result, the ADC output value is written into the 10-bit location in the data buffer that corresponds to the first sequencer register for sequencer 73. Because in this example there is a second sequencer register value stored in the second sequencer register, the sequencer count advances to "2" and the next sequencer register value is serviced starting on the next rising CLK edge CB11.

Of importance, note that the level of the S/H signal 69 can be changed (for example, the S/H signal can be asserted in a low-to-high transition) in a latency period 129 of less than eight SCLK periods after the rising edge of trigger signal 123. The S/H signal 69 can be asserted in this way even though all the DATAIN bit values have not yet been transferred to the analog die. In addition, within a latency period 130 of approximately two SCLK periods from the time of the asserting of the trigger signal, the first bit of DATAIN is being output from the digital die 2 onto SDATA terminal 9.

In the illustrated example, there are no parity bits or error detection and correction for the S/H signal bit. Delays associated with error detection functionality are therefore avoided. If counter 105 on the analog die becomes desynchronized with respect to the state of state machine 103 on the digital die, then the circuitry on the analog die can be reset under the control of processor 41 by sending a reset command 127 to the analog die across the second serial bus. Analog die control 96 detects the reset command 127 and outputs a reset signal 128 that resets counter 105 and flip-flops D1-D8. After this resetting, the serial bus interface 72 on the digital die can send another complete DATAIN value with the serial bus interfaces on the digital and analog dice being properly synchronized with respect to one another. The reset command 127 is communicated across a higher latency bus, but the delay in the resetting of the serial bus interface 93 is acceptable. Such resetting occurs only very seldom and is an error condition.

Figure 11:
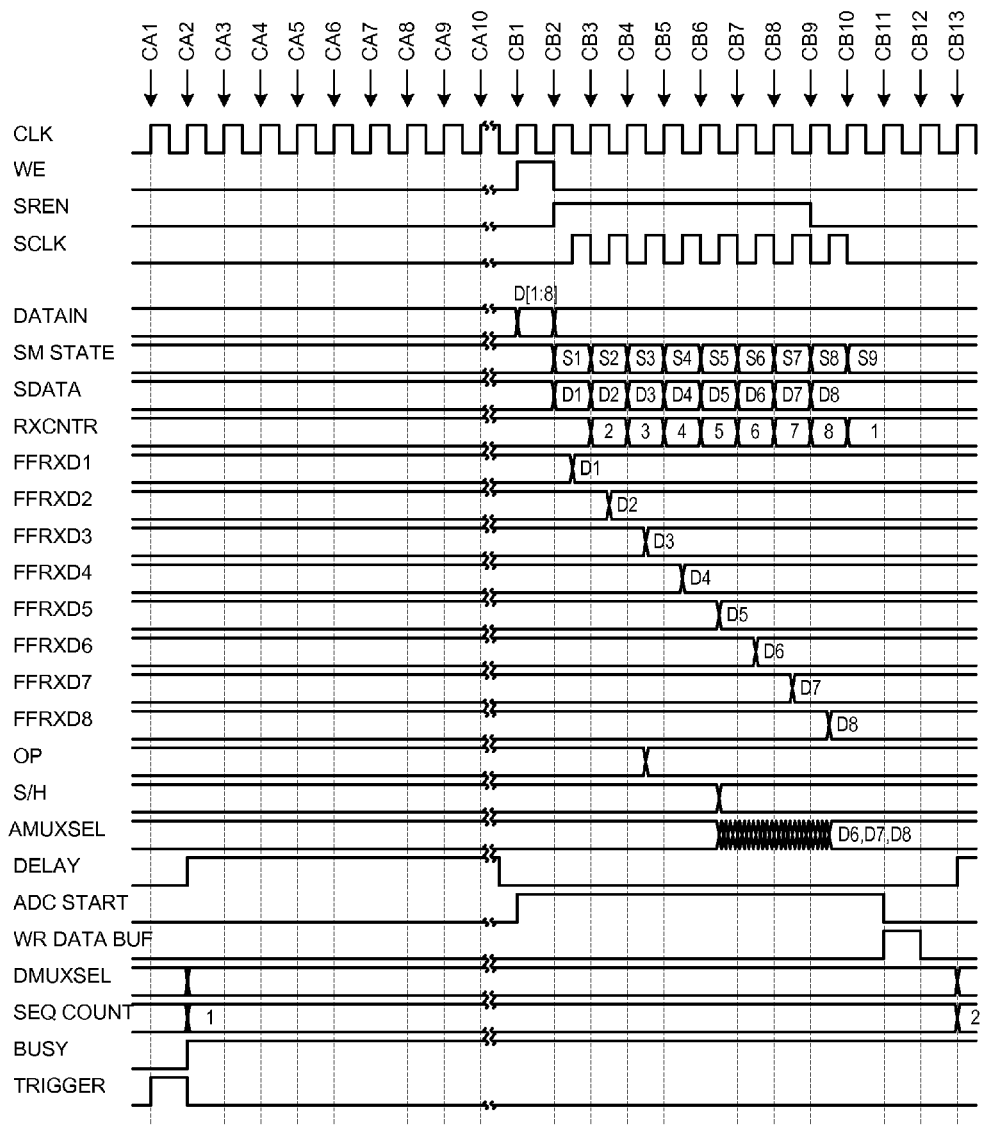
FIG. 11 is a simplified waveform diagram illustrating an operation involving sequencer register contents where the "TX-BUS TRANSMISSION WE START OPTIONS" field bits are set to the "SEND DATATIN AFTER ADC START" option.

FIG. 11 is a simplified waveform diagram illustrating an operation involving sequencer register contents where the 3-bit "TX-BUS TRANSMISSION WE START OPTIONS" field bits are set to the "SEND DATATIN AFTER ADC START" option. In response to the trigger signal 123 being asserted high at the time of a rising edge of CLK, the sequencer 73 asserts its BUSY signal on conductor 126, enters its sequence count "1" state, outputs the DMUXSEL values to DMUX 75, and starts a delay timer as in the example of FIG. 10, but in the example of FIG. 11 the sequencer 73 does not supply an 8-bit DATAIN value at rising CLK edge CA2. The 4-bit delay setting of the sequencer register value determines a number of clock cycles until the internal DELAY signal transitions low. At the end of the delay period, in response to the DELAY signal being a digital low, the sequencer 73 asserts the ADC START signal on the next rising CLK edge CB1. As mentioned above, ADC 76 has its own sample and hold circuitry, so once the ADC START signal 115 has transitioned high the analog voltage on the signal input lead of the ADC can be changed without affecting operation of the ADC. In the example of FIG. 11, sequencer 73 asserts the write enable signal WE and outputs the DATAIN value starting at clock edge CB1. Accordingly, the DATAIN value bits are shifted out of the digital die and are loaded into the analog die at the same time that the ADC is performing an analog-to-digital conversion.

Figure 12:
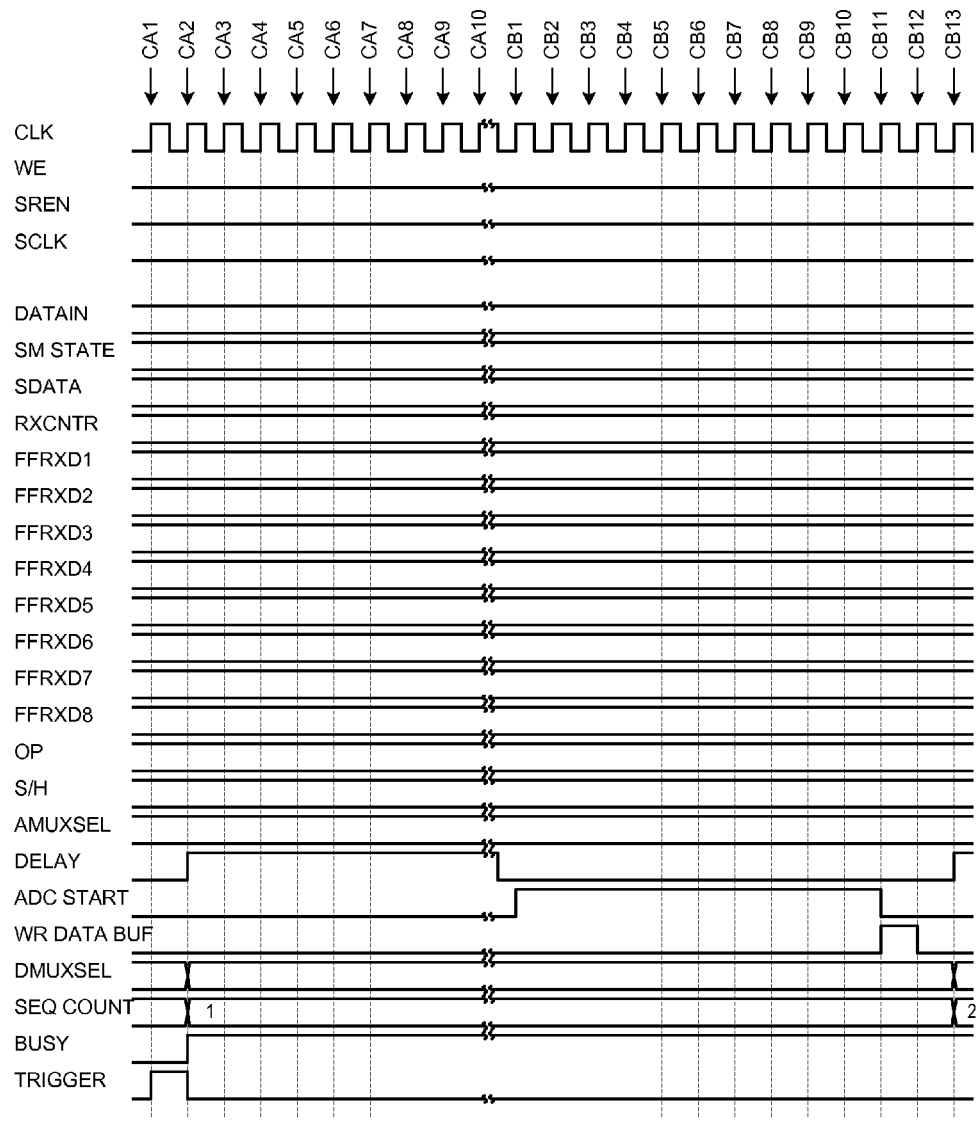
FIG. 12 is a simplified waveform diagram illustrating an operation involving sequencer register contents where the "TX-BUS TRANSMISSION WE START OPTIONS" field bits are set to the "DO NOT SEND DATATIN" option.

FIG. 12 is a simplified waveform diagram illustrating an operation involving sequencer register contents where the 3-bit "TX-BUS TRANSMISSION WE START OPTIONS" field bits are set to the "DO NOT SEND DATATIN" option. The delay determined by the 4-bit delay setting transpires, and an analog-to-digital conversion occurs, but no DATAIN value is transferred from the digital die to the analog die. Accordingly, the AMUX setting and the S/H signal values are not changed.

Although the waveform examples of FIGS. 10, 11 and 12 as shown starting with a pulsing high of a trigger signal, the pulsing of a trigger signal is generally only used to start a sequencer making a pass through its sequencer register entries. After handling one sequencer register entry, the sequencer automatically proceeds to the next sequencer register entry. A second trigger is not supplied. Once the sequencer has handled its last sequencer register entry (as determined by the applicable one of fields 121 and 122 that indicates the number of legitimate sequencer entries present), then the sequencer returns to an idle state and asserts an interrupt signal. The interrupt signal alerts processor 41 that the ADC output values are present in data buffer 77.

There are two sequencers in the specific embodiment described. If one sequencer is busy as indicated by the BUSY signal it supplies to the other sequencer, then the other sequencer does not start a transaction across the low latency serial bus but rather waits a cycle of CLK and then retests the BUSY signal.

Figure 13:
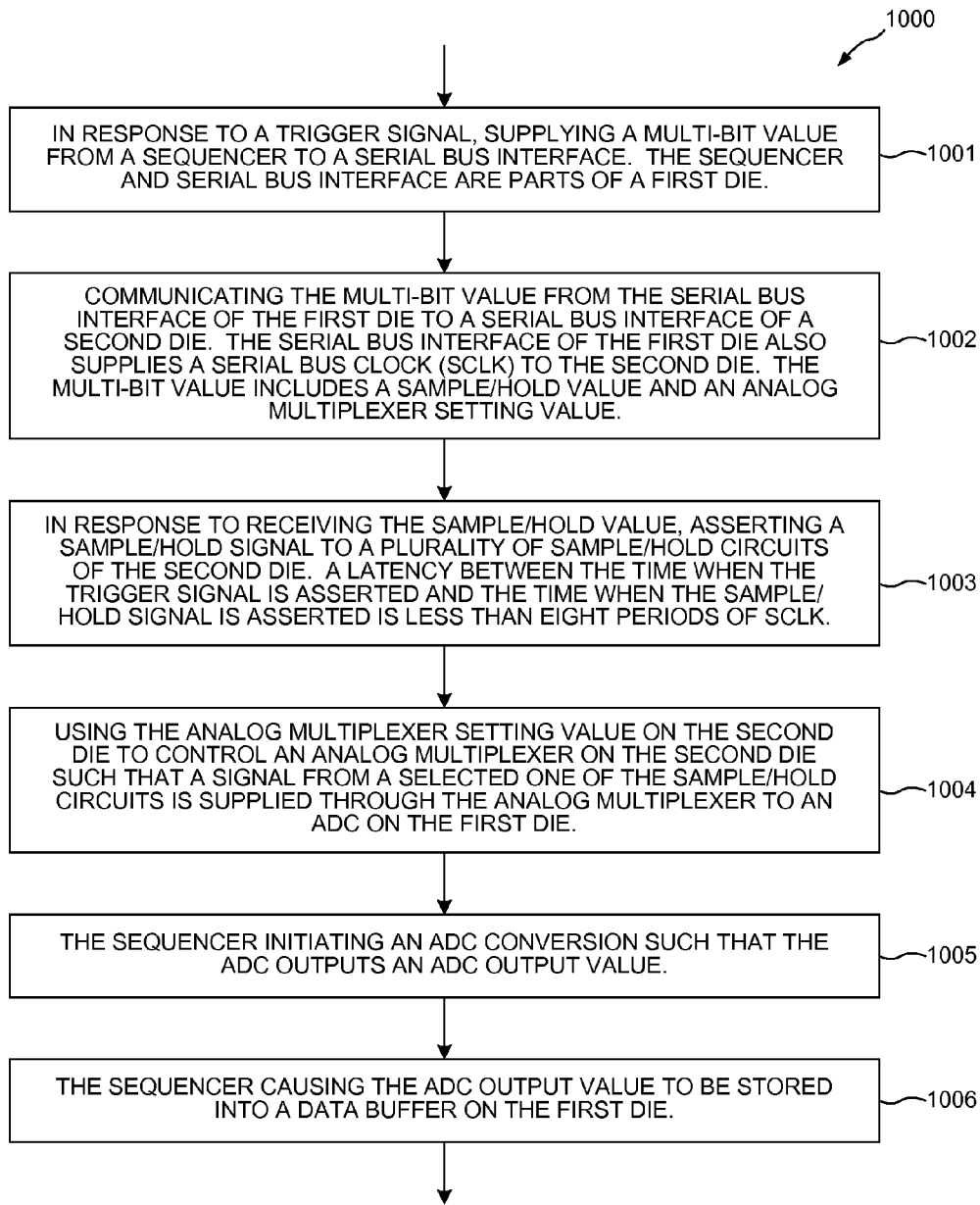
FIG. 13 is a flowchart of a method of operation of the packaged controller 1 of FIG. 1.

FIG. 13 is a flowchart of a method 1000 in accordance with one novel aspect. In response to a trigger signal being asserted on a first die, a sequencer supplies (step 1001) a multi-bit value to a serial bus interface. The sequencer and the serial bus interface are parts of the first die. The multi-bit value is then communicated (step 1002) in serial fashion from the first die to a serial bus interface of a second die. The serial bus interface of the first die also supplies an associated serial bus clock (SCLK) to the second die. The multi-bit value includes a sample/hold value and an analog multiplexer setting value. In response to receiving the sample/hold value, a sample/hold signal on the second die is asserted (step 1003) to a plurality of sample/hold circuits on the second die. In one example, this asserting of the sample/hold signal is a low-to-high transition of the sample/hold signal. A latency between the time when the trigger signal is asserted and the time when the sample/hold signal is asserted is less than eight periods of SCLK. The analog multiplexer setting value is used (step 1004) on the second die to control an analog multiplexer on the second die such that a signal from a selected one of the sample/hold circuits is supplied through the analog multiplexer, through a single terminal of the second die, through a single terminal of the first die, and to an input load of an ADC on the first die. The sequencer then initiates (step 1005) an analog-to-digital conversion such that the ADC outputs an ADC output value. The sequencer then causes (step 1006) the ADC output value to be stored into a data buffer on the first die.

In one example, after the steps of FIG. 13 have been carried out, the sequencer on the first die causes a second multi-bit value to be communicated serially to the second die so that a second selected one of the sample/hold circuits is coupled through the analog multiplexer to the input lead of the ADC. The sequencer then initiates a second ADC conversion, and causes the resulting second ADC output value to be written into the data buffer. The sequencer repeats this process multiple times so that the that the voltage samples held in each of the various sample/hold circuits is multiplexed out of the second die and is digitized, one by one, by the ADC on the first die. After all the sample voltages held in the sample/hold circuits have been digitized as directed by the sequencer, the sequencer interrupts the processor. The processor can then read the ADC output values out of the data buffer in a single efficient read operation.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A packaged controller comprising:
a first die comprising a processor, a first terminal, an analog-to-digital converter (ADC), a serial bus interface, and a sequencer, wherein the ADC is coupled to receive an analog signal from the first terminal, wherein the sequencer is coupled to supply a start convert signal to the ADC, and wherein the sequencer is programmable by the processor;
a second die comprising a serial bus interface, a first terminal, a plurality of sample/hold circuits, and an analog multiplexer, wherein a serial bus clock signal is communicated from the serial bus interface of the first die to the serial bus interface of the second die, wherein the analog multiplexer couples an output lead of a selected one of the sample/hold circuits to the first terminal of the second die such that a signal from the selected one of the sample/hold circuits is supplied through the first terminal of the second die and through the first terminal of the first die to the ADC of the first die, wherein a trigger signal is asserted within the first die and in response the sequencer causes a first multi-bit value to be communicated from the serial bus interface of the first die to the serial bus interface of the second die, wherein a receiving of at least part of the first multi-bit value onto the second die: 1) causes a sample/hold signal supplied to the plurality of sample hold circuits to be asserted, and 2) determines which one of the sample/hold circuits is coupled through the analog multiplexer to the first terminal of the second die, wherein a latency period between a time when the trigger signal is asserted and a time when the sample/hold signal is asserted is less than eight periods of the serial bus clock signal; and a package that contains the first die and the second die.

2. The packaged controller of claim 1, wherein the first die further comprises a second terminal, wherein the second die further comprises a second terminal, wherein the second terminal of the first die is coupled to the second terminal of the second die, and wherein the sequencer causes a bit of the first multi-bit value to be output from the serial bus interface of the first die onto the second terminal of the first die within approximately two serial bus clock signal periods of the asserting of the trigger signal.

3. The packaged controller of claim 1, wherein the first multi-bit value includes a sample/hold value and an analog multiplexer setting value, wherein the sample/hold value determines a level of the sample/hold signal, and wherein the analog multiplexer setting value determines which one of the sample/hold circuits is coupled through the analog multiplexer to the first terminal of the second die.

4. The packaged controller of claim 3, wherein the analog multiplexer setting value is a multi-bit value, and wherein the sample/hold signal is asserted during the latency period before all the bits of the analog multiplexer setting value have been received on the second die.

5. The packaged controller of claim 1, wherein the first die further comprises a data buffer, wherein the ADC outputs ADC output values, and wherein the sequencer controls a storing of the ADC output values into the data buffer.

6. The packaged controller of claim 1, wherein the sequencer causes a second multi-bit value to be communicated from the serial bus interface of the first die to the serial bus interface of the second die, wherein a receiving of the second multi-bit value onto the second die does not cause a level of the sample/hold signal to be changed but does cause a change in which one of the sample/hold circuits is coupled through the analog multiplexer to the first terminal of the second die.

7. The packaged controller of claim 1, wherein the sequencer is programmable by the processor to use a selected one of a plurality of signals as the trigger signal.

8. The packaged controller of claim 1, wherein the sequencer is programmable by the processor to cause the sample/hold signal to be simultaneously asserted to each of the sample/hold circuits and then to control the analog multiplexer and the ADC such that an ADC output value is obtained for each sample/hold circuit before the sample/hold signal is asserted a second time, and wherein the sequencer controls a writing of the obtained ADC output values into a data buffer.

9. The packaged controller of claim 1, wherein the sequencer comprises a plurality of sequencer registers, wherein each sequencer register includes a delay setting field and a multi-bit value field, wherein a delay value stored in a delay setting field determines a delay until the start convert signal is asserted, and wherein a multi-bit value stored in the multi-bit value field is a multi-bit value that is supplied in parallel fashion from the sequencer to the serial bus interface of the first die.

10. The packaged controller of claim 1, wherein the first multi-bit value is not shifted into any shift register in the second die.

11. The packaged controller of claim 10, wherein the first multi-bit value is shifted out of the first die on rising edges of the serial bus clock signal, wherein the serial bus interface of the second die includes a plurality of flip-flops, and wherein each bit of the first multi-bit value is clocked into a corresponding one of the plurality of flip-flops on a corresponding falling edge of the serial bus clock.

12. The packaged controller of claim 10, wherein the first multi-bit value is shifted out of the first die on falling edges of the serial bus clock signal, wherein the serial bus interface of the second die includes a plurality of flip-flops, and wherein each bit of the first multi-bit value is clocked into a corresponding one of the plurality of flip-flops on a corresponding rising edge of the serial bus clock.

13. The packaged controller of claim 1, wherein the first die includes a second serial bus interface, wherein the second die includes a second serial bus interface, wherein a reset command is communicated from the first die to the second die through the second serial bus interface of the first die and through the second serial bus interface of the second die, and wherein in response to the reset command being received on the second die the serial bus interface on the second die is reset.

14. A method comprising:
(a) in response to an asserting of a trigger signal on a first die supplying a first multi-bit value in parallel from a sequencer to a serial bus interface, wherein the sequencer and the serial bus interface are parts of the first die;
(b) communicating the first multi-bit value from the serial bus interface of the first die to a serial bus interface of a second die, wherein the serial bus interface of the first die supplies a serial bus clock signal to the serial bus interface of the second die, and wherein the first multi-bit value includes a sample/hold value and an analog multiplexer setting value;
(c) in response to receiving the sample/hold value onto the second die asserting a sample/hold signal to a plurality of sample/hold circuits of the second die, wherein a latency period between a time when the trigger signal is asserted on the first die and a time when the sample/hold signal is asserted on the second die is less than eight periods of the serial bus clock signal;
(d) using the analog multiplexer setting value on the second die to control an analog multiplexer of the second die such that a signal output from a first selected one of the sample/hold circuits is supplied through the analog multiplexer to an analog-to-digital converter (ADC) on the first die;
(e) the sequencer initiating a first analog-to-digital conversion of the ADC such that the ADC outputs a first ADC output value; and
(f) the sequencer causing the first ADC output value to be stored in a data buffer of the first die, wherein the first die and the second die are parts of a packaged controller.

15. The method of claim 14, wherein the first die further comprises a second terminal, wherein the second die further comprises a second terminal, wherein the second terminal of the first die is coupled to the second terminal of the second die, and wherein the sequencer causes a bit of the first multi-bit value to be output from the serial bus interface of the first die onto the second terminal of the first die within approximately two serial bus clock signal periods of the asserting of the trigger signal.

16. The method of claim 14, further comprising:
(g) supplying a second multi-bit value in parallel from the sequencer to the serial bus interface of the first die;
(h) communicating the second multi-bit value from the serial bus interface of the first die to the serial bus interface of a second die;
(i) in response to receiving the second multi-bit value onto the second die controlling the analog multiplexer such that a signal output from a second selected one of the sample/hold circuits is supplied through the analog multiplexer to the ADC of the first die without a level of the sample/hold signal being changed;
(j) the sequencer initiating a second analog-to-digital conversion of the ADC such that the ADC outputs a second ADC output value; and
(k) the sequencer causing the second ADC output value to be stored in the data buffer of the first die.

17. The method of claim 14, further comprising:
(g) communicating a command from the first die to the second die across a second serial bus, and in response to receiving the command on the second die the serial bus interface on the second die is reset.

18. An assembly comprising:
a plurality of sample/hold circuits disposed on a second die;
a terminal on the second die;
an analog multiplexer disposed on the second die and controllable to couple a selected one of the sample/hold circuits to the terminal on the second die;
a data buffer disposed on a first die;
an analog-to-digital converter (ADC) disposed on the first die;
a terminal on a first die; and
means for receiving a trigger signal and in response communicating a multi-bit value in serial fashion from the first die to the second die, wherein the means supplies a serial bus clock signal from the first die to the second die, wherein the means is also for: 1) causing a sample/hold signal supplied to the plurality of sample hold circuits to be asserted, and 2) controlling the analog multiplexer such that a selected first one of the sample/hold circuits is coupled through the terminal of the second die and the terminal of the first die to the ADC, such that a latency period between a time when the trigger signal is received and a time when the sample/hold signal is asserted is less than eight periods of the serial bus clock signal, and wherein the means is also for causing the ADC to perform a first analog-to-digital conversion thereby outputting a first ADC output value, and is also for causing the first ADC output value to be stored into the data buffer.

19. The assembly of claim 18, wherein the means is also for controlling the analog multiplexer such that a selected second one of the sample/hold circuits is coupled through the terminal of the second die and the terminal of the first die to the ADC without a level of the sample/hold signal being changed so that the ADC then performs a second analog-to-digital conversion thereby outputting a second ADC output value, wherein the means is also for causing the second ADC output value to be stored into the data buffer.

20. The assembly of claim 18, wherein the means comprises a serial bus interface on the first die, a sequencer on the first die, and a serial bus interface on the second die.

\* \* \* \* \*